(12) United States Patent
An

(10) Patent No.: US 7,616,521 B2
(45) Date of Patent: Nov. 10, 2009

(54) SEMICONDUCTOR MEMORY DEVICE SELECTIVELY ENABLING ADDRESS BUFFER ACCORDING TO DATA OUTPUT

(75) Inventor: Yong-Bok An, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 11/529,260

(22) Filed: Sep. 29, 2006

(65) Prior Publication Data

US 2007/0070787 A1 Mar. 29, 2007

(30) Foreign Application Priority Data

Sep. 29, 2005 (KR) ............... 10-2005-0090878
May 31, 2006 (KR) ............... 10-2006-0049129

(51) Int. Cl.
*G11C 8/00* (2006.01)
(52) U.S. Cl. .................. 365/230.08; 365/189.05
(58) Field of Classification Search ............ 365/230.08, 365/189.05
See application file for complete search history.

(56) References Cited

U.S. PATENT DOCUMENTS 5,812,492 A * 9/1998 Yamauchi et al. ........ 365/233.5
6,274,931 B1 * 8/2001 Jeon et al. .................. 257/734
6,483,760 B2 * 11/2002 Kang .......................... 365/201
6,795,369 B2    9/2004 Choi et al.
6,982,923 B2    1/2006 Ootsuki
2004/0100853 A1 5/2004 Choi et al.

FOREIGN PATENT DOCUMENTS

| JP | 9-198875 | 7/1997 |
| JP | 2002-184180 | 6/2002 |
| JP | 2002-358784 | 12/2002 |
| KR | 1997-0051264 | 7/1997 |
| KR | 1997-0051318 | 7/1997 |
| KR | 0125314 | 12/1997 |

OTHER PUBLICATIONS

Korean Office Action issued in corresponding Korean Patent Application No. KR 10-2006-0049129, dated Apr. 26, 2007.

* cited by examiner

*Primary Examiner*—Huan Hoang
*Assistant Examiner*—Kretelia Graham
(74) *Attorney, Agent, or Firm*—IP & T Law Firm PLC

(57) ABSTRACT

A semiconductor memory device can reduce needless current consumption when addresses are inputted. A semiconductor memory device includes a clock enable buffering unit for receiving a clock enable signal to output a buffer enable signal, an address buffer control unit for generating an address buffer control signal in response to a plurality of data output mode, and an address buffering unit for receiving an address in response to the buffer enable signal and the address buffer control signal.

11 Claims, 3 Drawing Sheets

US 7,616,521 B2

SEMICONDUCTOR MEMORY DEVICE SELECTIVELY ENABLING ADDRESS BUFFER ACCORDING TO DATA OUTPUT

The present application contains subject matter related to the Korean patent application Nos. KR 2005-0090878 and KR 2005-49129, filed in the Korean Patent Office on Sep. 29, 2005, and on May 31, 2006 respectively, the entire contents of which being incorporated herein by reference.

FIELD OF THE INVENTION

The present invention relates to a semiconductor memory device, and more particularly, to an address buffer of the semiconductor memory device.

DESCRIPTION OF RELATED ARTS

A semiconductor device is designed by logic design technique and fabricated by silicon wafer processing technique. A final product through the silicon water processing technique is formed in a shape of a plastic package chip. The plastic package chip has plural logic circuits for performing specific operations in respect to usages. Generally, the plastic package chip is placed in a printed circuit board (PCB) and is provided a power supply voltage from a power providing unit in the PCB.

Typically, a semiconductor device such as a memory device receives a plurality of signals and performs an operation corresponding to combination of the plurality of signals. Then, the semiconductor device outputs result signals generated from the performed operation. The result signals are outputted into another semiconductor device in the PCB.

Input buffers in the semiconductor device are used for receiving and buffering input signals. A static buffer is widely used as a input buffer. The static buffer includes two inverters, each inverter having a PMOS transistor and a NMOS transistor connected between a power supply voltage and a ground voltage in series. The static buffer has an advantage for simply configuration but should receive an input signal having a wide pulse because of weakness of noise. That is, the input signal should have a wide logic low level and a wide logic high level. Hence, the static buffer can not be arranged in the semiconductor device that should be operated in a high frequency.

In order to receive input signals having a high frequency, a differential input buffer is suggested for the high-speed semiconductor device. The differential input buffer includes a differential amplifier and receives a signal pair containing two different signals. The differential input buffer is called a dynamic input buffer.

FIG. 1 is a block diagram of a semiconductor memory device.

As shown, the semiconductor memory device includes a clock enable buffer 11, address buffers 12 to 15, and a bank address buffer 11. The clock enable buffer 11 receives a clock enable signal CKE and outputs a buffer enable signal ENB. The address buffers 12 to 15 are enabled in response to the buffer enable signal ENB and receives addresses ADD<0:13> to output internal addresses ADDOUT<0:13> respectively. The bank address buffer 16 are enabled in response to the buffer enable signal ENB and receives bank addresses BA<0:3> to internal bank addresses ABOUT<0:3>.

If the buffer enable signal ENB is activated as a logic low level, the address buffers 12 to 15 and the bank address buffer 16 are enabled. If buffer enable signal ENB is inactivated as a logic high level, the address buffers 12 to 15 and the bank address buffer 12 are disabled.

FIG. 2 is a schematic circuit diagram of a clock enable buffer in FIG. 1.

As shown, the clock enable buffer 11 includes a differential amplifier and inverts IV21 and IV22. The differential amplifier compares a voltage level of a reference signal VREF with that of the clock enable signal CKE.

The differential amplifier includes a NMOS transistor QN20 having a gate connected to the reference signal VREF, a NMOS transistor QN21 having a gate connected to the clock enable signal CKE, PMOS transistors QP20 and QP21 respectively connected between a power supply voltage VDD and the NMOS transistors QN20 and QN21, a NMOS transistor QN22 having a gate connected to an inverse signal of the enable signal CKE_ENB through an inverter IV20 and arranged between a common node of the NMOS transistors QN20 and QN21 and a ground voltage VSS, and a PMOS transistor QP22 having a gate connected to an inverted signal of the enable signal CKE_ENB through the inverter IV20 and arranged between the power supply voltage VDD and a node NA. The PMOS transistors QP20 and QP21 are configured as a current mirror.

The inverters IV21 and IV22 are connected to the node NA in series and buffer a signal of the node NA to output a buffer enable signal ENB.

Since the clock enable buffer 11 outputs the buffer enable signal ENB for controlling the address buffer 12 to 16, the clock enable buffer 11 is operated before operating of the address buffers 12 to 16. If the enable signal CKE_ENB is activated as a logic low level, the clock enable buffer 11 is enabled. Otherwise, if the enable signal CKE_ENB is activated as a logic high level, the clock enable buffer 11 is disabled.

The voltage level of the reference signal VREF is maintained as a predetermined level, e.g., a half of a power supply voltage VDD. The reference signal VREF is inputted from the external or can be generated from a circuit in the semiconductor memory device.

A certain amount of current determined by a reference signal VREF flows through the MNOS transistor QN20. A certain amount of current determined by a clock enable signal CKE flows through the MNOS transistor QN21. If the voltage level of the clock enable signal CKE is higher than that of the reference signal VREF, an amount of current through the NMOS transistor QN21 is larger than that of current through the NMOS transistor QN20. Then, the voltage level of the node NA becomes lower and the buffer enable signal ENB has a logic low level. Alternatively, if the voltage of the clock enable signal CKE is lower than that of the reference signal VREF, an amount of current through the NMOS transistor QN21 is smaller than that of current through the NMOS transistor QN20. Then, the voltage level of the node NA becomes higher and the buffer enable signal ENB has a logic high level.

The PMOS transistor PQ22 is turned in response to a logic high level of the enable signal CKE_ENB. During the PMOS transistor QP22 is turned on, the buffer enable signal ENB is maintained as a logic high level.

FIG. 3 is a schematic circuit diagram of an address buffer in FIG. 1.

As shown, the address buffer 13 includes a differential amplifier and inverts IV30 and IV31. The differential amplifier compares a voltage of a reference signal VREF with a voltage of the address ADD<11>.

The differential amplifier in the address buffer 13 includes a NMOS transistor QN30 having a gate connected to the reference signal VREF, a NMOS transistor QN31 having a gate connected to the address ADD<11>, PMOS transistors QP30 and QP31 respectively connected between the power supply voltage VDD and the NMOS transistors QN30 and QN31, a NMOS transistor QN32 having a gate connected to an inverted signal of the clock enable signal ENB through an inverter IV30 and arranged between a common node of the NMOS transistors QN30 and QN31 and a ground voltage VSS, and a PMOS transistor QP32 having a gate connected to an inverse signal of the clock enable signal ENB through the inverter IV30 and arranged between the power supply voltage VDD and a node NB. The PMOS transistors QP30 and QP31 are configured as a current mirror.

The inverter IV31 is connected to the node NB and inverts a signal of the node NB to output an internal address ADDOUT<11>.

If the clock enable signal ENB is activated as a logic low level, the address buffer 13 is enabled. Otherwise, if the clock enable signal ENB is activated as a logic high level, the address buffer 13 is disabled. As described above, the voltage of the reference signal VREF is maintained as a predetermined level, e.g., a half of a power supply voltage VDD.

A certain amount of current determined by a reference signal VREF flows through the MNOS transistor QN30. A certain amount of current determined by an address signal ADD<11> flows through the MNOS transistor QN31. If the voltage level of the address signal ADD<11> is higher than that of the reference signal VREF, an amount of current through the NMOS transistor QN31 is larger than that of current through the NMOS transistor QN30. Then, the voltage level of the node NB becomes lower and the internal address signal ADDOUT<11> has a logic low level. Otherwise, if the voltage level of the address signal ADDD<11> is lower than that of the reference signal VREF, an amount of current through the NMOS transistor QN31 is smaller than that of current through the NMOS transistor QN30. Then, the voltage level of the node NB becomes higher and the internal address signal ADDOUT<11> has a logic high level.

The PMOS transistor PQ32 is turned in response to the logic high level of the clock enable signal ENB. During the PMOS transistor QP32 is turned on, the internal address signal ADDOUT<11> is maintained as a logic high level.

Meanwhile, a semiconductor memory device accesses the number bit of data corresponding to data access mode. For instance, the semiconductor memory device outputs or receives 16 bit data on an X16 output mode, and outputs or receives 8 bit data on an X8 output mode for one data access operation.

Also, the number of addresses used corresponding to data access mode is changed. For example, at the X16 output mode, a semiconductor memory device such as a double data rate 2 (DDR2) memory uses 13 addresses ADD<0> to ADD<12> for row address and uses 10 addresses ADD<0> to ADD<9> for column address. At the X8 output mode, the semiconductor memory device uses 14 addresses ADD<0> to ADD<13> for row address and uses 10 addresses ADD<0> to ADD<9> for column addresses. At the X4 output mode, the semiconductor memory device uses 14 addresses ADD<0> to ADD<13> for row address and uses 11 addresses ADD<0> to ADD<9> and ADD<11> for column address.

As described above, according to the data output mode, the number of addresses that the semiconductor memory device uses is different. However, the semiconductor memory device uses all the address buffers regardless of the data output mode. Since all the address buffers are enabled regardless of the data output mode, unnecessary current consumption is occurred.

SUMMARY OF THE INVENTION

It is, therefore, an object of the present invention to provide a semiconductor memory device and an operation method thereof, which can reduce unnecessary current consumption when addresses are inputted.

In accordance with an aspect of the present invention, there is provided a semiconductor memory device, including an address buffer control unit for generating an address buffer control signal in response to a data output mode and an address buffering unit for selectively buffering an inputted address in response to the address buffer control signal.

In accordance with another aspect of the present invention, there is provided a semiconductor memory device, including a clock enable buffering unit for receiving a clock enable signal to output a buffer enable signal, an address buffer control unit for generating an address buffer control signal in response to a plurality of data output mode, a plurality of first address buffering units for receiving an first address in response to the buffer enable signal, and a plurality of second address buffering units for receiving an second address in response to the buffer enable signal and the address buffer control signal.

In accordance with further another aspect of the present invention, there is provided a method for operating a semiconductor memory device, including generating a buffer enable signal in response to a clock enable signal, generating an address buffer control signal in response to a plurality of data output modes, receiving a first address in response to the buffer enable signal, and receiving a second address in response to the buffer enable signal and the address buffer control signal.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

An internal voltage generation circuit in accordance with various embodiments of the present invention will be described in detail with reference to the accompanying drawings.

Figure 1:
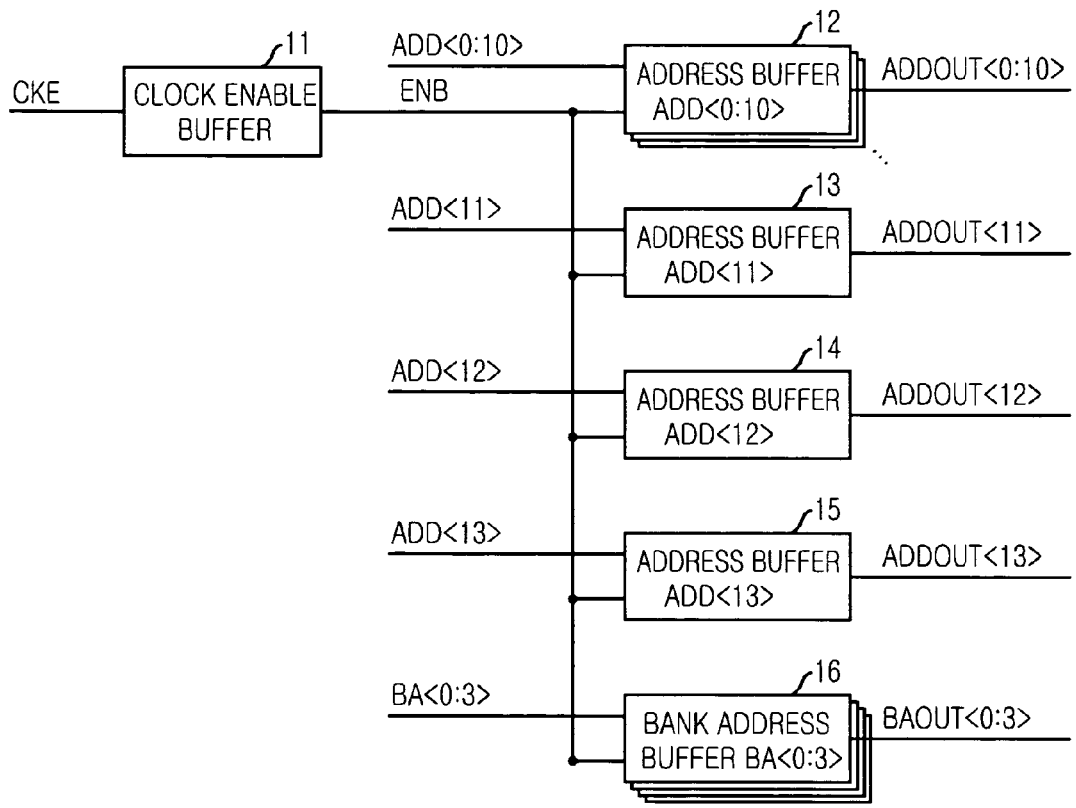
FIG. 1 is a block diagram showing a semiconductor memory device.
Figure 2:
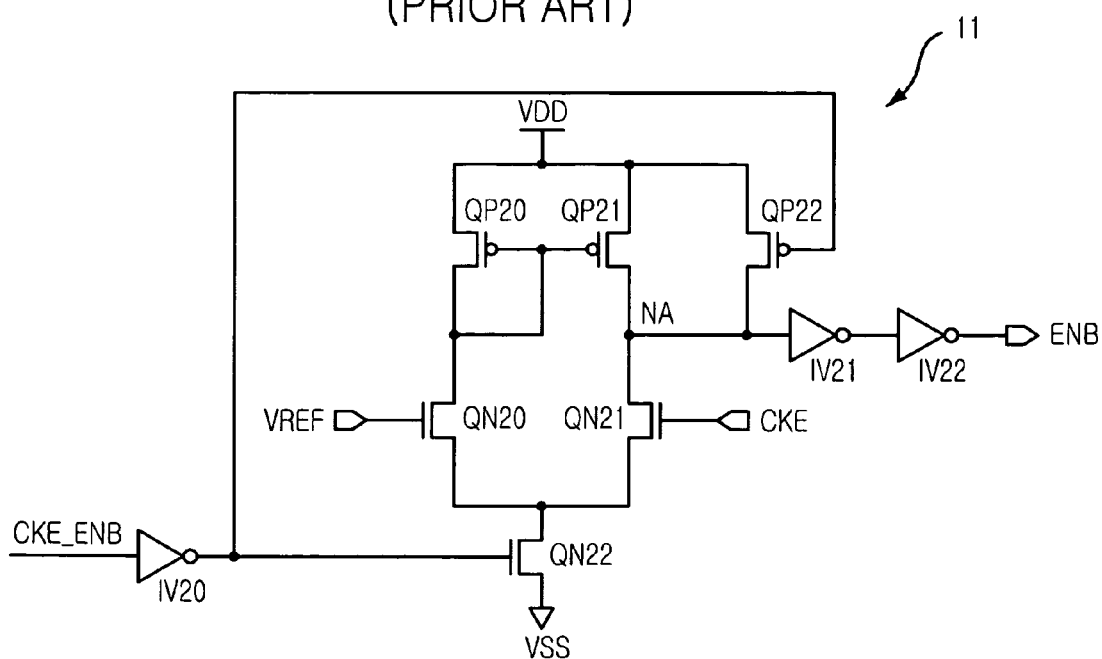
FIG. 2 is a schematic circuit diagram describing a clock enable buffer in FIG. 1.
Figure 3:
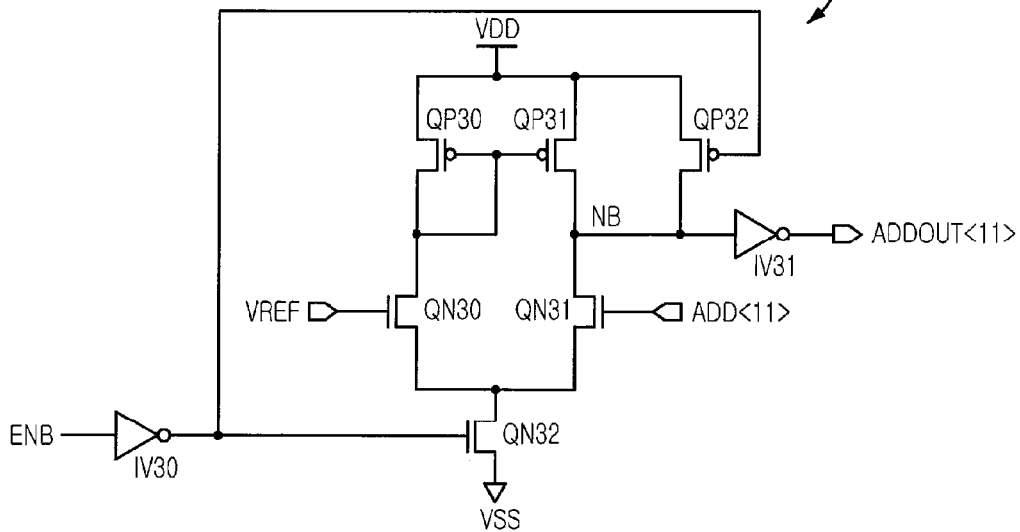
FIG. 3 is a schematic circuit diagram depicting an address buffer in FIG. 1.
Figure 4:
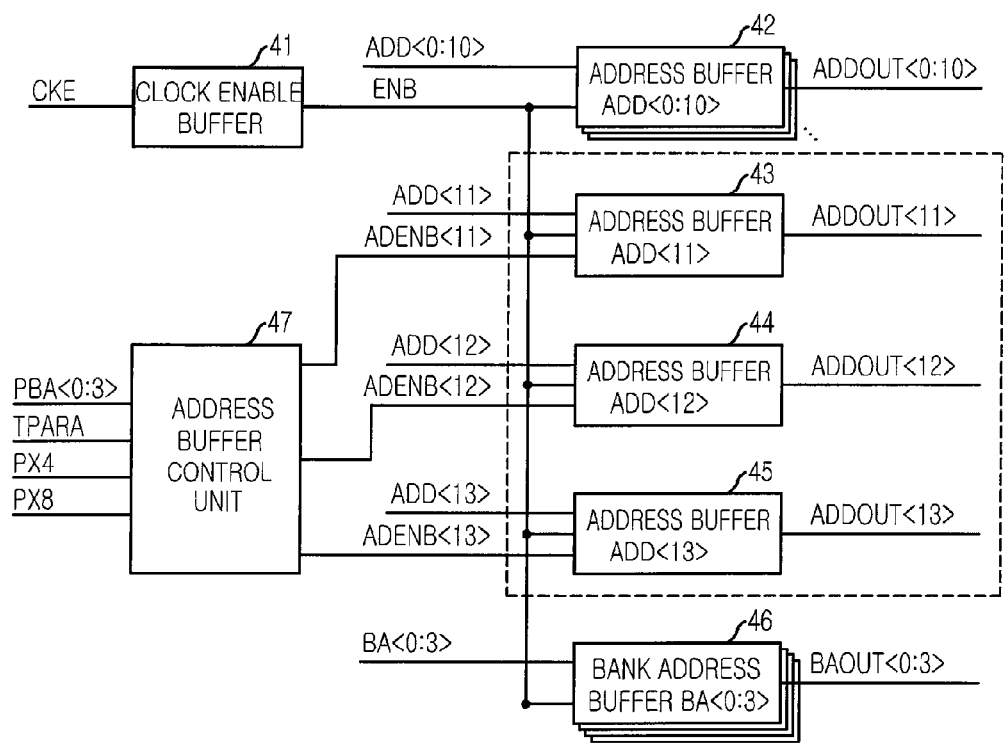
FIG. 4 is a block diagram showing a semiconductor memory device in accordance with an embodiment of the present invention.

FIG. 4 is a block diagram of a semiconductor memory device in accordance with an embodiment of the present invention.

As shown, the semiconductor memory device includes a clock enable buffer 41, a plurality of address buffers 42 to 45, a bank address buffer 46, and an address buffer control unit 47.

The clock enable buffer 41 receives a clock enable signal CKE and outputs a buffer enable signal ENB. The address buffers 42 to 45 are enabled in response to the clock enable signal ENB and receives addresses ADD<0:13> to output internal addresses ADDOUT<0:13>. In detail, the address buffer 42 receives addresses ADD<0:10> to output internal addresses ADDOUT<0:10>. The address buffer 43 receives addresses ADD<11> to output internal addresses ADDOUT<11>. The address buffer 44 receives addresses ADD<12> to output internal addresses ADDOUT<12>. The address buffer 45 receives addresses ADD<13> to output internal addresses ADDOUT<13>.

The bank address buffer 46 is enabled in response to the clock enable signal ENB and receives bank addresses BA<0:3> to output internal bank addresses BAOUT<0:3>. The address buffer control unit 47 generates address buffer signals ADENB<11>, ADENB<12>, and ADENB<13> in response to signals PBA<0:3>, TPARA, PX4, and PX8. The bank active signals PBA<0:3> are signals for activating corresponding bank. The parallel test signal TPARA is a test signal for testing the semiconductor memory device at a test mode. The X4 mode signal is a data output mode setting signal to output 4 bit data at one data access. The X8 mode signal is a data mode setting signal to output 8 bit data at one data access.

The address buffer 42 is enabled except that the clock signal is inactivated as a logic low at a power down mode. Since the address buffers 43, 44, and 45 is controlled by the buffer enable signal ENB and address buffer control signals ADENB<11:13>, the address buffers 43, 44, and 45 can be disable during a predetermined period except the power down mode.

Figure 5:
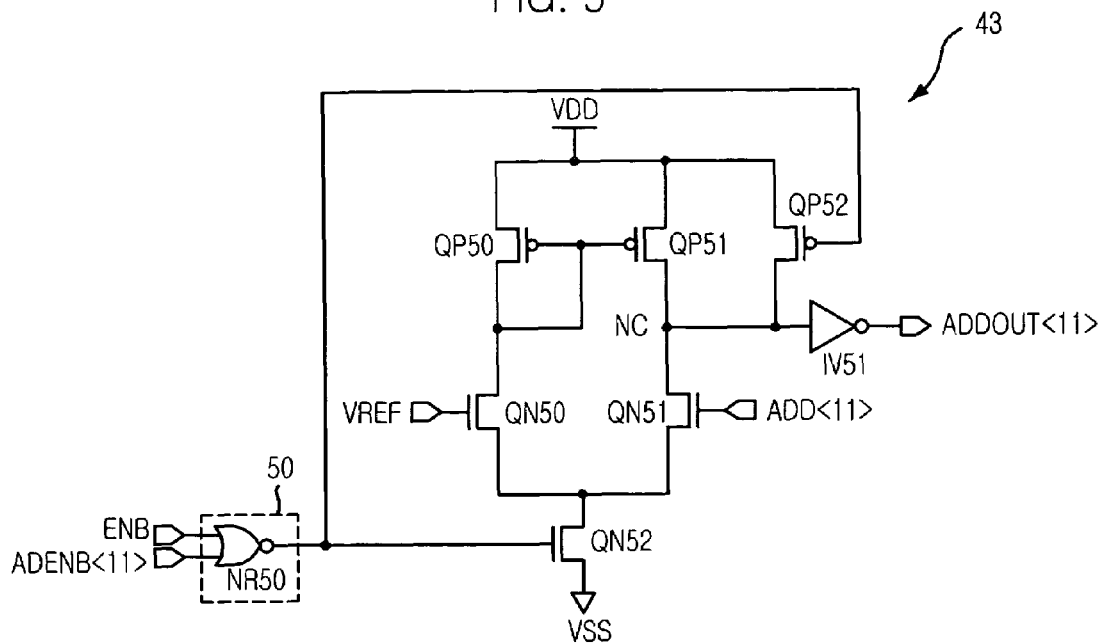
FIG. 5 is a schematic circuit diagram depicting an address buffer in FIG. 4.

FIG. 5 is a schematic circuit diagram of an address buffer in FIG. 4.

As shown, the address buffer 43 includes a differential amplifier and an enable signal combination unit 50. The differential amplifier compares a voltage level of a reference signal VREF with that of the address ADD<11>.

The differential amplifier in the address buffer 43 includes a NMOS transistor QN50 having a gate connected to the reference signal VREF, a NMOS transistor QN51 having a gate connected to the address ADD<11>, PMOS transistors QP50 and QP51 respectively connected between the power supply voltage VDD and the NMOS transistors QN50 and QN51, a NMOS transistor QN52 having a gate connected to the output of the enable signal combination 50 and arranged between a common node of the NMOS transistors QN50 and QN51 and a ground voltage VSS, and a PMOS transistor QP52 having a gate connected to the output of the enable signal combination 50 and arranged between the power supply voltage VDD and a node NC. The PMOS transistors QP50 and QP51 are configured as a current mirror.

The inverters IV51 are connected the node NC and inverts a signal of the node NC to output an internal address ADDOUT<11>.

The enable signal combination unit 50 includes a logic NOR gate NR50 for receiving the buffer enable signal ENB and the address buffer control signal ADENB<11> to output a result of logic NOR operation into the differential amplifier.

The enable signal combination unit 50 activates the output signal as a logic high level in response to a logic low level of the buffer enable signal ENB and a logic low level of the address buffer control signal ADENB<11>. Although the buffer enable signal ENB has a logic low level and if the address buffer control signal ADENB<11> has a logic high level, The enable signal combination unit 50 can not activate the output signal as a logic high level. Thus, the differential amplifier is not enabled. That is, the address buffer 43 is not enabled.

Meanwhile, the address buffer 42 receives addresses ADD<0:10> to output internal addresses ADDOUT<0:10> in response to the buffer enable signal ENB.

Figure 6:
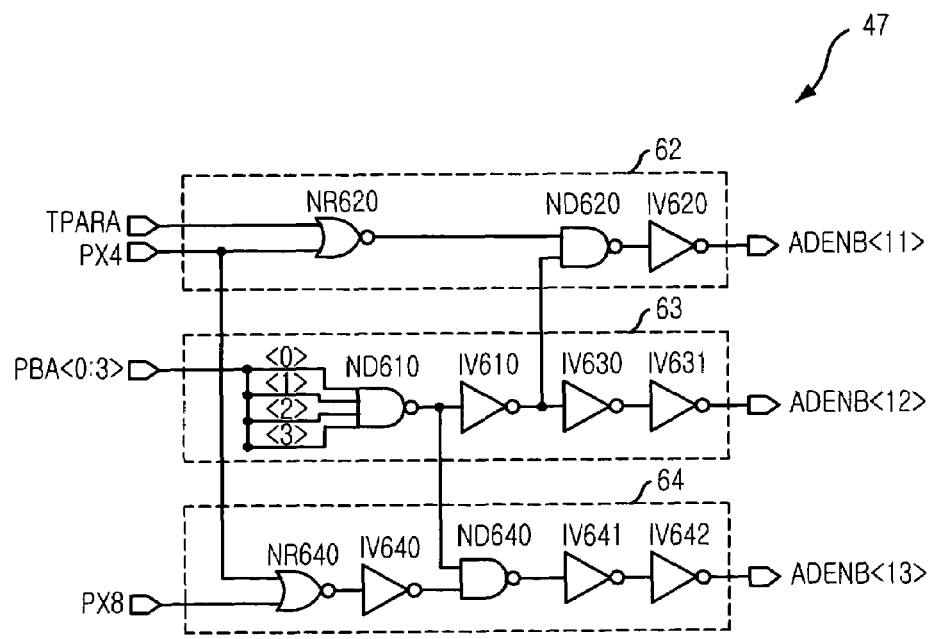
FIG. 6 is a schematic circuit diagram describing an address buffer control unit in FIG. 4.

FIG. 6 is a schematic circuit diagram of an address buffer control unit in FIG. 4.

As shown, the address buffer control unit 47 includes a first buffer control signal generating unit 62, a second buffer control signal generating unit 63, and a third buffer control signal generating unit 64.

The first buffer control signal generating unit 62 generates a first address buffer control signal ADENB<11> for enabling the address buffer 43 buffer corresponding to address number 11. The second buffer control signal generating unit 63 generates a second address buffer control signal for enabling the address buffer 44 corresponding to address number 12. The third buffer control signal generating unit 64 generating a third address buffer control signal for enabling the address buffer 45 corresponding to address number 13.

The first buffer control signal generating unit 62 includes a logic NOR gate NR620 for receiving a parallel test signal TPARA and a X4 mode signal PX4, a logic NAND gate ND620 for receiving an output of an inverter IV610 and an output of the logic NOR gate NR620, and a fourth inverter IV620 for receiving an output of the logic NAND gate ND620 to output the first address buffer control signal ADENB<11>.

The second buffer control signal generating unit includes a logic NAND gate ND610 for receiving first to fourth bank active signals PBA<0:3>, an inverter IV610 for receiving an output of the logic NAND gate ND610, an inverter IV630 for receiving an output of the inverter IV610, and an inverter IV631 for receiving an output of the inverter IV630 to output the address buffer control signal ADENB<12>.

The third buffer control signal generating unit 64 includes a logic NOR gate NR640 for receiving the X4 mode signal PX4 and a X8 mode signal PX8, an inverter IV640 for receiving an output of the second logic NOR gate NR640, a logic NAND gate ND640 for receiving an output of the inverter IV640 and the output of the logic NAND gate ND610, an inverter IV641 for receiving an output of the logic NAND gate IV641, an inverter IV642 for receiving an output of the inverter IV641 to output the third address buffer control signal ADENB<13>.

The address buffers 43, 44, and 45 correspond to the address number 11, 12, and 13 respectively. Also, the address buffers 43, 44, and 45 are selectively enabled according to the data output mode, i.e., X4 output mode, X8 output mode, and X16 output mode.

The semiconductor memory device in accordance with various embodiments of the present invention performs an operation at five operation modes: the bank active mode that all the banks is activated, a parallel test mode, X4 output mode, X8 output mode, and X16 output mode.

Typically, the X4 output mode or the X8 output mode is set for connecting an X4 pad or an X8 pad to a power supply voltage or a ground voltage. For example, if the X4 pad is connected to the power supply voltage and the X8 pad is connected to the ground voltage, the semiconductor memory device operates at the X4 output mode. In this case, the X4 mode signal has a logic high level and the X8 mode signal has a logic low level. If the X4 pad is connected to the ground voltage and the X8 pad is connected to the power supply voltage, the semiconductor memory device operates at the X8 output mode. In this case, the X4 mode signal has a logic low level and the X8 mode signal has a logic high level.

The bank address 46 receives bank addresses BA<0:3> and generates internal bank addresses ABOUT<0:3>. Then, a bank or banks corresponding to the internal bank addresses ABOUT<0:3> are activated. The address buffers 42 to 45 are commonly used for receiving a row address and a column address. At first, the address buffers 42 to 45 receives row addresses as address signals ADD<10> to ADD<13> and generates internal addresses ADDOUT<10> to ADDOUT<13>. And then, column addresses as address signals ADD<10> to ADD<13> are inputted to the address buffers 42 to 45. According to data output mode, the number of inputting row or column addresses is changed. Thus, address buffers that not receive an address can not be enabled.

The bank active signals PBA<0:3> are enabled as a logic high level when corresponding banks are activated. If all the banks are activated, the output of the logic NAND gate ND610 is a logic low level. The output of the logic NAND gate ND610 is transferred to the third buffer control signal generating unit 64. The output of the inverter IV610 is a logic high level. The output of the inverter IV610 is transferred to the first buffer control signal generating unit 64. Since the output of the logic NAND gate ND640 is a logic low level, the third address buffer control signal ADENB<13> is activated as a logic high level regardless of the output of the inverter IV640. Thus, the address buffer 45 controlled by the third address buffer control signal ADENB<13> is disabled.

On the X4 output mode, the address buffer 43 corresponding to the address ADD<11> should be used. On the X4 output mode, the X4 mode signal has a logic high level and the X8 mode signal has a logic low level. The output of the logic NAND gate NR620 is a logic low level and the first address buffer control signal ADENB<11> is activated as a logic high level. Thus, the address buffer 43 controlled by the first address buffer control signal ADENB<11> is enabled.

On a parallel test mode, the parallel test signal TPARA has a logic high level. The output of the logic NAND gate NR620 is a logic low level and the first address buffer control signal ADENB<11> is activated as a logic high level. Thus, the address buffer 43 controlled by the first address buffer control signal ADENB<11> is enabled.

On an operation mode that all the banks are activated, the address ADD<12> is not used as a column address. If all the banks are activated, the output of the logic NAND gate ND610 is a logic low level and the output of inverter IV631 is a logic high level. That is, the second address buffer control signal ADENB<12> is inactivated as a logic high level. Thus, the address buffer 44 controlled by the second address buffer control signal ADENB<12> is disabled. Current consumption by enabling of the address buffer 44 is removed.

The address ADD<11> is used as a column address on the X4 output mode and the X8 output mode. On the X4 output mode, the X4 mode signal PX4 has a logic low level and on the X8 output mode, the X8 mode signal PX8 has a logic low level. Thus, the output of the logic NOR gate NR640 is a logic high level and the third address buffer control signal ADENB<13> is inactivated as a logic high level. Thus, the address buffer 45 controlled by the second address buffer control signal ADENB<13> is disabled.

As described above, the semiconductor memory device disables address buffers 44 and 45 because the address ADD<12> and the address ADD<13> are not used as a column address when column addresses are inputted on the X4 output mode. The semiconductor memory device disables address buffers 43, 44, and 45 because the address ADD<11>, the address ADD<12>, and the address ADD<13> are not used as a column address when column addresses are inputted on the X8 output mode. Also, on the X8 output mode, the semiconductor memory device disables address buffers 43, 45, and 45 because the address ADD<11>, the address ADD<12>, and the address ADD<13> are not used as a column address when column addresses are inputted, and disables address buffer 45 because the address ADD<13> is not used as a row address when row addresses are inputted.

On the operation mode that all the banks are activated, e.g., a refresh operating mode, the semiconductor memory device can disable all the address buffers 42 to 45 because none of all the address buffers are used to receive row addresses and column addresses.

Therefore, unnecessary current consumption caused by address buffers that addresses not receive can be removed when addresses are inputted to the semiconductor memory device.

The block diagram or schematic circuit diagram according to above described embodiment can be modified based on a kind of inputted signals of an activation logic level of the inputted signals. In the described embodiment, the enable signal combination unit includes a logic NOR gate. However, the enable signal combination unit can include a logic NAND gate or anther logic gates in other embodiment. Also, in the described embodiment, the address buffer has a differential amplifier configured by PMOS transistor as load. However, the address buffer may have a differential amplifier configured by NMOS transistor as load.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device, comprising:
    a clock enable buffering unit for receiving a clock enable signal to output a buffer enable signal;
    an address buffer control unit for generating an address buffer control signal in response to a plurality of data output modes;
    a plurality of first address buffers for receiving a first address in response to the buffer enable signal; and
    a plurality of second address buffers for receiving an second address in response to the buffer enable signal and selecting bits of the second address, corresponding to the data output mode, according to the address buffer control signal, wherein the second address buffers include an enable signal combination unit for combining the buffer enable signal and the address buffer control signal to output an enable signal.

2. The semiconductor memory device of claim 1, further comprising:
    a bank address buffering unit for receiving a bank address in response to the buffer enable signal.

3. The semiconductor memory device of claim 1, wherein the second address buffer further includes:
    a differential amplifying unit for receiving a reference signal and an address signal as differential input signals in response to the enable signal; and
    a buffering unit for buffering an output of the differential amplifying unit to output an internal address.

4. The semiconductor memory device of claim 3, wherein the enables signal combination unit includes:
    a logic NOR gate for receiving the buffer enable signal and the address buffer control signal to output a result of logic NAND operation.

5. The semiconductor memory device of claim 1, wherein the first address buffer includes:
- an inverter for inverting the buffer enable signal to output an enable signal;
- a differential amplifying unit for receiving a reference signal and an address signal as differential input signals in response to the enable signal; and
- a buffering unit for buffering an output of the differential amplifying unit to output an internal address.

6. The semiconductor memory device of claim 5, wherein the first address buffer receives an address corresponding to one of address numbers 1 to 10.

7. The semiconductor memory device of claim 3, wherein the second address buffer receives an address corresponding to one of address numbers 11 to 13.

8. The semiconductor memory device of claim 1, wherein the address buffer control unit includes:
- a first buffer control signal generating unit for generating a first address buffer control signal for enabling one of the first address buffers corresponding to address number 11;
- a second buffer control signal generating unit for generating a second address buffer control signal for enabling one of the first address buffers corresponding to address number 12; and
- a third buffer control signal generating unit generating a third address buffer control signal for enabling one of the first address buffers corresponding to address number 13.

9. The semiconductor memory device of claim 8, wherein the second buffer control signal generating unit includes:
- a first logic NAND gate for receiving first to fourth bank active signals;
- a first inverter for receiving an output of the first logic NAND gate; a second inverter for receiving an output of the first inverter; and
- a third inverter for receiving an output of the second inverter to output the second address buffer control signal.

10. The semiconductor memory device of claim 9, wherein the first buffer control signal generating unit includes:
- a first logic NOR gate for receiving a parallel test signal and a X4 mode signal;
- a second logic NAND gate for receiving an output of the first inverter and an output of the first logic NOR gate;
- a fourth inverter for receiving an output of the second logic NAND gate to output the first address buffer control signal.

11. The semiconductor memory device of claim 9, wherein the third buffer control signal generating unit includes:
- a second logic NOR gate for receiving the X4 mode signal and a X8 mode signal;
- a fifth inverter for receiving an output of the second logic NOR gate;
- a third logic NAND gate for receiving an output of the fifth inverter and the output of the first logic NAND gate;
- a sixth inverter for receiving an output of the third logic NAND gate; and
- a seventh inverter for receiving an output of the sixth inverter to output the third address buffer control signal.

* * * * *